US012791603B2

(12) United States Patent
Sun et al.

(10) Patent No.: US 12,791,603 B2
(45) Date of Patent: Nov. 10, 2026

(54) APPARATUS AND METHOD FOR PROBING DEVICE-UNDER-TEST

(71) Applicant: Taiwan Semiconductor Manufacturing Company, Ltd., Hsinchu (TW)

(72) Inventors: Chuan-Hsiang Sun, Taoyuan City (TW); Shu An Shang, Kaohsiung City (TW); Kai-Yi Tang, New Taipei City (TW); Yuan-Li Lin, Taichung City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 183 days.

(21) Appl. No.: 18/931,109

(22) Filed: Oct. 30, 2024

(65) Prior Publication Data

US 2026/0118405 A1 Apr. 30, 2026

(51) Int. Cl.

*G01R 31/28* (2006.01)
*G01R 1/067* (2006.01)
*G01R 1/18* (2006.01)

(52) U.S. Cl.

CPC ..... *G01R 31/2808* (2013.01); *G01R 1/06772* (2013.01); *G01R 1/18* (2013.01); *G01R 31/2886* (2013.01)

(58) Field of Classification Search

CPC .. G01R 31/2808; G01R 1/06772; G01R 1/18; G01R 31/2886

See application file for complete search history.

(56) References Cited

U.S. PATENT DOCUMENTS

2023/0068552 A1* 3/2023 Sun .................... G01R 1/06761

* cited by examiner

*Primary Examiner* — G.M. A Hyder

(74) *Attorney, Agent, or Firm* — JCIPRNET

(57) ABSTRACT

An apparatus for probing a device-under-test (DUT) includes a fixture disposed over the DUT, a circuitry film attached to the fixture, probe contacts disposed on the circuitry film and extending toward the DUT, a circuit board electrically coupled to the circuitry film, a first high frequency signal line and a second high frequency signal line laterally spaced apart from the first high frequency signal line. The first and second high frequency signal lines are included in at least one of the circuitry film or the circuit board. A shielding structure is interposed between the first and second high frequency signal lines and includes a first shielding pattern close to the first high frequency signal line and a second shielding pattern close to the second high frequency signal line and laterally spaced apart from the first shielding pattern.

20 Claims, 9 Drawing Sheets

APPARATUS AND METHOD FOR PROBING DEVICE-UNDER-TEST

BACKGROUND

With the evolving of semiconductor technologies, integrated circuit (IC) devices get smaller and the functionalities continue to increase. The testing of the IC devices plays an important role in IC manufacturing to ensure the functionalities of the IC devices. Typically, the prober station is configured to provide the testing signals for a device-under-test (DUT) through a probe card which includes a probe head connected to a printed circuit board (PCB). Although existing methods and apparatus of testing have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
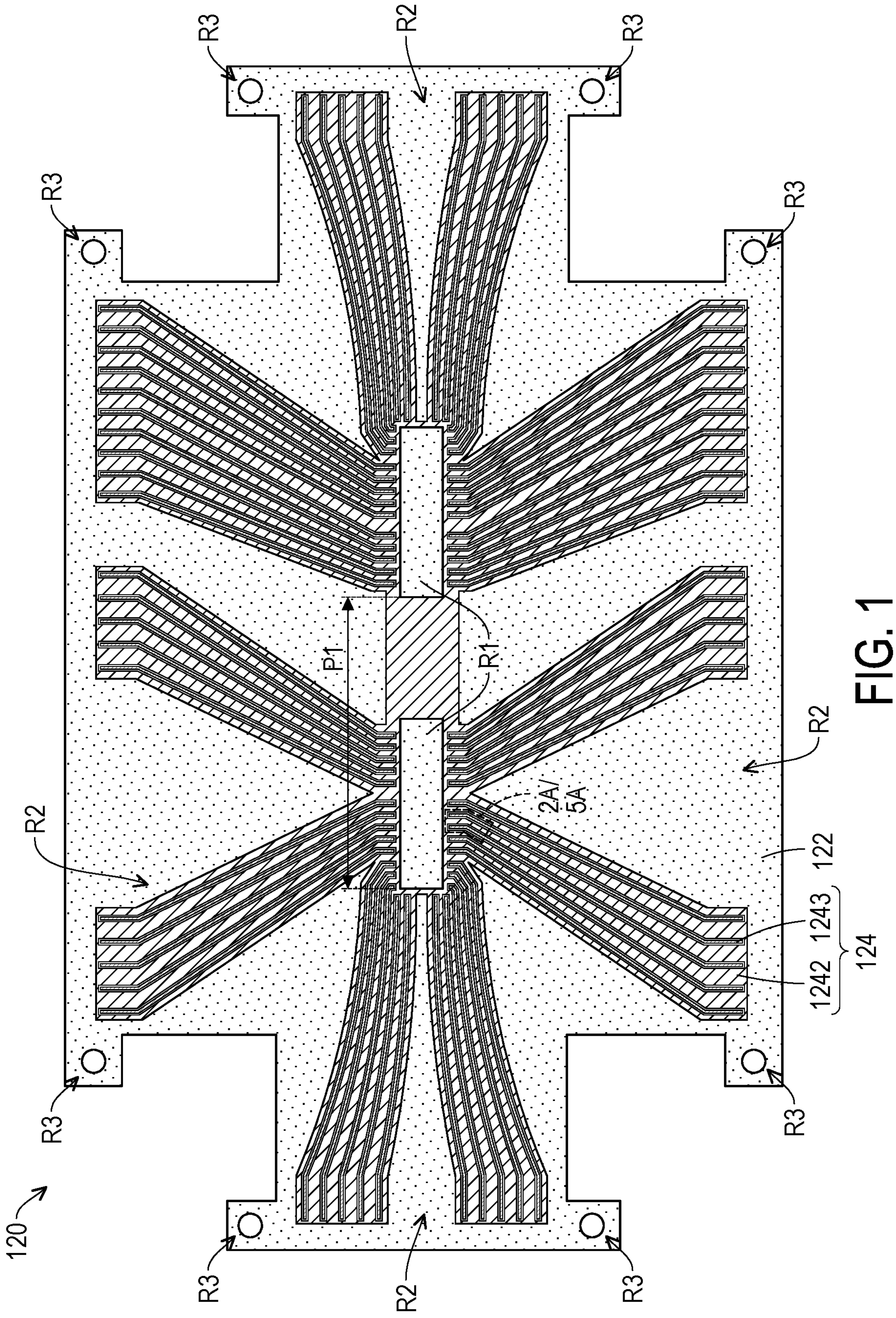
FIG. 1 is a schematic view of a circuitry film in a deployment state according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor manufacturing implements probe testing to qualify and/or sort integrated circuit (IC) devices on a wafer. In a probe test, a probing apparatus may be used and configured to couple a tester to a wafer to be tested. The probing apparatus may include a fixture, a circuitry film attached to the fixture, a circuit board attached to the fixture and electrically coupled to the circuitry film, and probe contacts electrically coupled to the circuitry film for testing of a plurality of devices-under-tests (DUTs). Currently, the spacing of the DUTs shrinks and the data rate of the DUTs increases in high frequency probing tests. The circuits in the circuitry film and/or the circuits in the circuit board designed for testing the DUTs arranged in the tightened spacing should become denser and faster. For a high density and high speed data circuitry, the signal lines are so close, and thus a greater possibility of electrical noise may be generated in the circuits in forms such as cross-talk and electromagnetic radiation.

Embodiments of the present disclosure provide an apparatus for probing a DUT and a method for probing a DUT, where the circuitry film and the circuit board are parts of the apparatus for probing the DUT. The circuits in the circuitry film and/or the circuits in the circuit board may be designed to limit crosstalk between adjacent signal paths. In radio frequency (RF) circuits, cross-talk increases as signal frequency increases. To minimize such crosstalk, a shield structure may be disposed in the circuits and configured to isolate the RF circuits and to prevent noise coupling between the circuits.

Figure 2B:
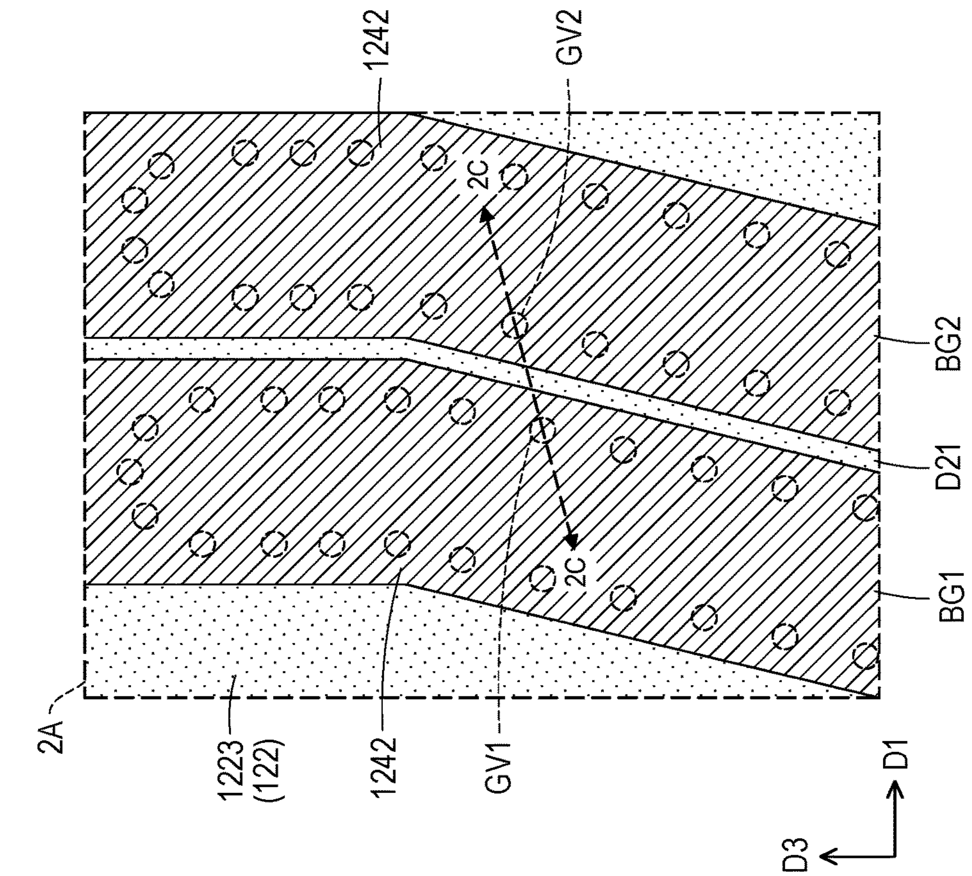
FIG. 2B is a schematic enlarged view of a lower level of the portion of the circuitry film outlined in the dashed box 2A of FIG. 1 according to some embodiments.
Figure 2A:
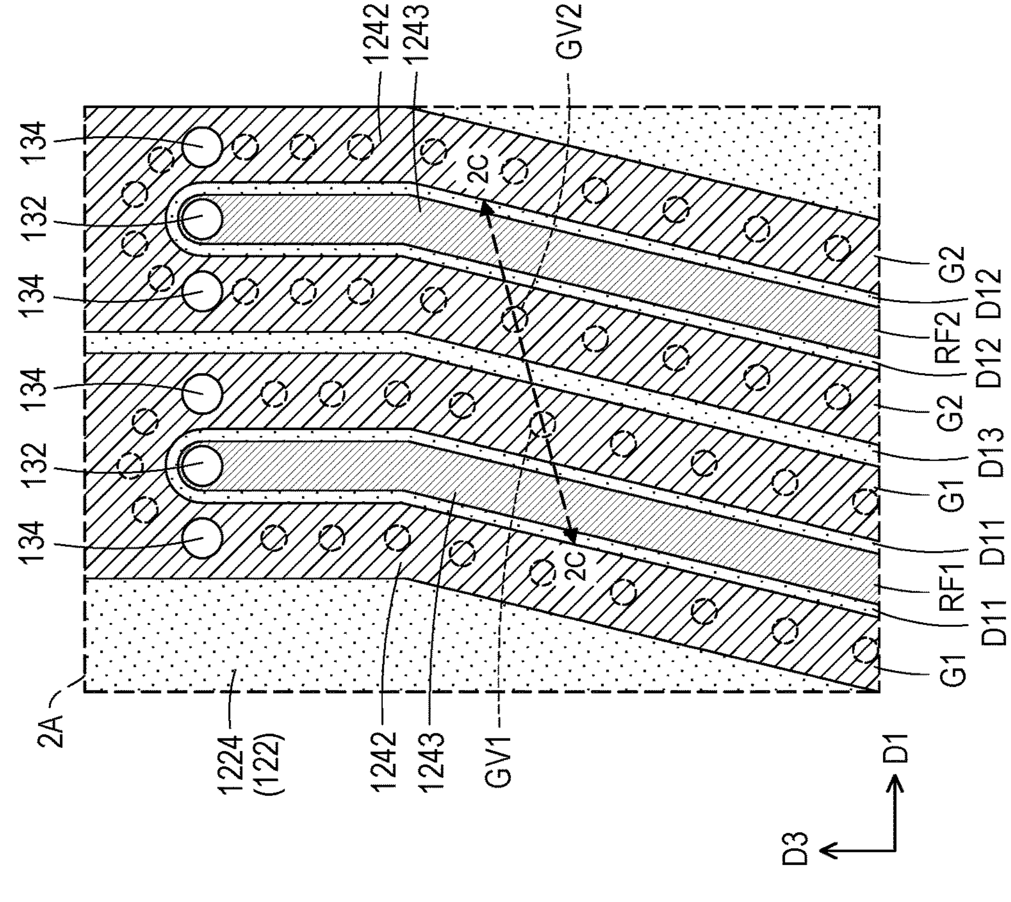
FIG. 2A is a schematic enlarged view of an upper level of a portion of the circuitry film outlined in the dashed box 2A in FIG. 1 according to some embodiments.
Figure 2C:
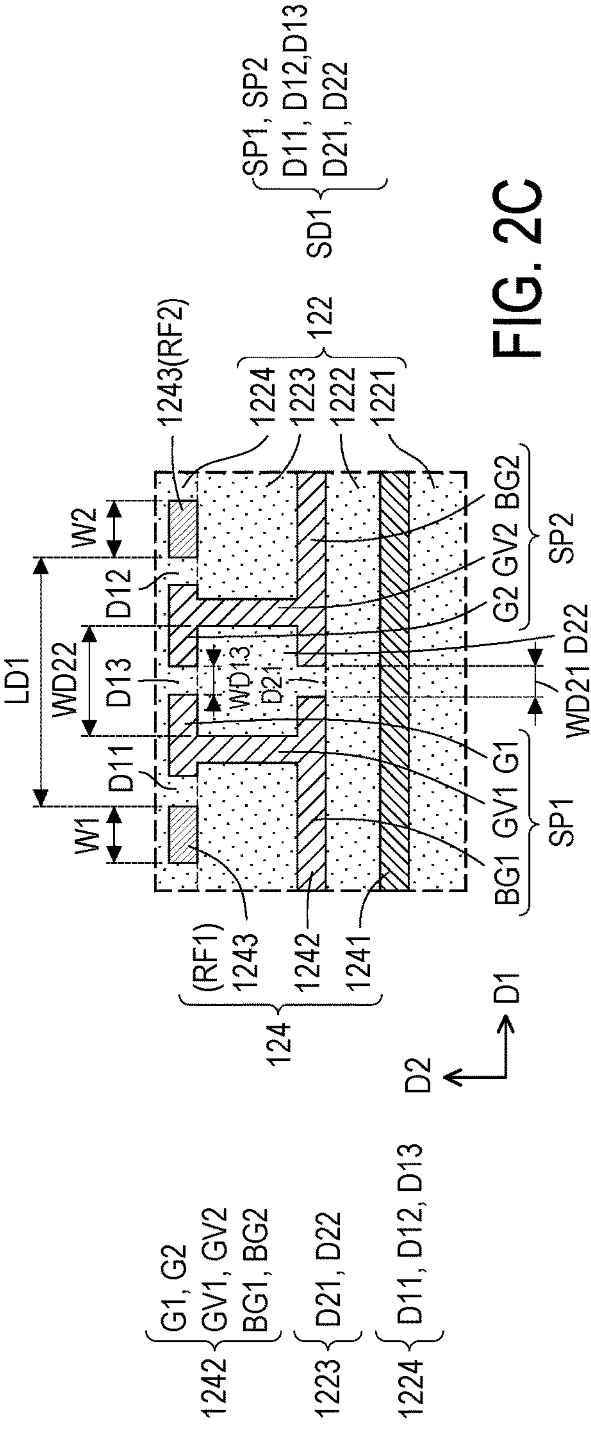
FIG. 2C is a schematic cross-sectional view of the portion of the circuitry film taken along the line 2B-2B of FIG. 2A or FIG. 2B according to some embodiments.
Figure 2D:
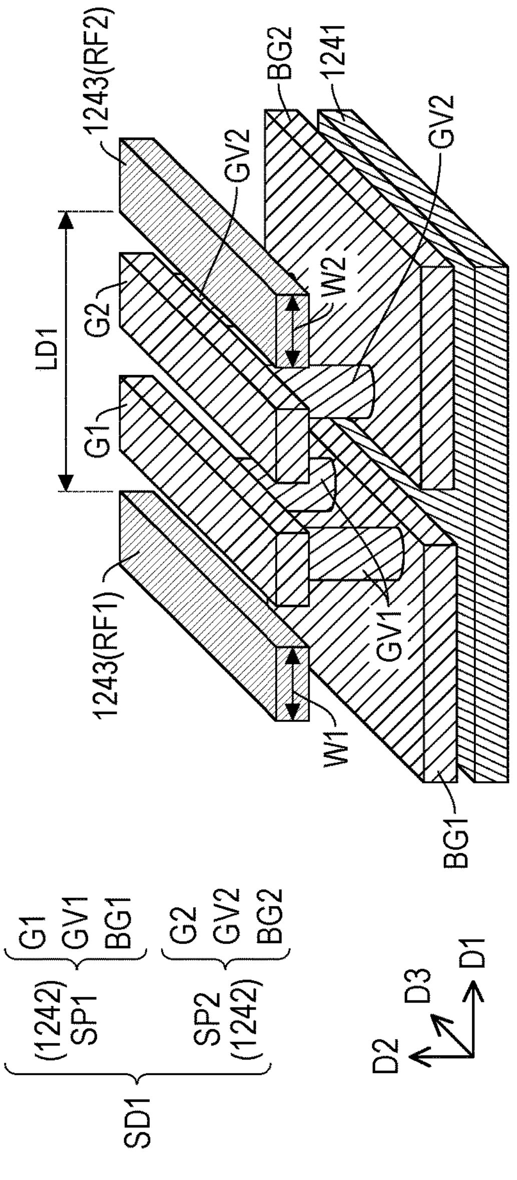
FIG. 2D is a schematic perspective view of the portion of the circuitry film shown in FIG. 2C according to some embodiments.

FIG. 1 is a schematic view of a circuitry film 120 in a deployment state before attaching to a fixture (see FIG. 7), FIG. 2A is a schematic enlarged view of an upper level of a portion of the circuitry film 120 outlined in the dashed box 2A in FIG. 1, FIG. 2B is a schematic enlarged view of a lower level of the portion of the circuitry film 120 outlined in the dashed box 2A of FIG. 1, FIG. 2C is a schematic cross-sectional view of the portion of the circuitry film 120 taken along the line 2B-2B of FIG. 2A or FIG. 2B, and FIG. 2D is a schematic perspective view of the portion of the circuitry film 120 shown in FIG. 2C, in accordance with some embodiments. It should be noted that the dielectric layer is not shown in FIG. 2D to more clearly illustrate details of the circuit layers.

Referring to FIG. 1, a circuitry film 120 in a deployment state may be provided. For example, the circuitry film 120 includes one or more first region(s) R1 corresponding to the DUT(s), one or more second region(s) R2 connected to the first regions R1 and configured to distribute various circuits therewithin, and one or more third region(s) R3 arranged at the periphery of the circuitry film 120 and functioning as fixing areas for affixing the circuitry film 120 to the fixture (see FIG. 7). In some embodiments, a pitch P1 is between adjacent two of the first regions R1. Although only two first regions R1 are shown in FIG. 1, other embodiments may include fewer or additional first regions R1, depending on the number of the DUTs. In addition, the circuit layout in the second regions R2 and the number of the third regions R3 shown in FIG. 1 are merely examples, and other embodiments may include fewer or additional circuits in the second regions R2 and fewer or additional third regions R3, depending on product requirements.

With continued reference to FIG. 1 and also referring to FIGS. 2A-2D, the circuitry film 120 may include one or more dielectric layer(s) 122 and one or more circuit layer(s) 124 distributed within the second regions R2 and covered by the dielectric layer 122. The respective circuit layer 124 may include conductive lines, conductive vias, conductive pads, etc. In some embodiments, the circuit layers 124 include transmission lines (e.g., power lines, ground lines, RF signal lines, I/O pads, and/or the like). For example, as shown in FIG. 2C, the circuitry film 120 includes a plurality of dielectric layers (1221, 1222, 1223, and 1224) stacked upon one another and a plurality of circuit layers (1241, 1242, and 1243) embedded in the dielectric layers (1221, 1222, 1223, and/or 1224). The dielectric layers (1221, 1222, 1223, and 1224) may include one or more insulating material such as an epoxy, polyimide, benzocyclobutene, polybenzoxazole, combinations thereof, any suitable electrical isolating material(s), etc. The circuit layers (1241, 1242, and 1243) may include one or more conductive material(s) such as copper, aluminum, nickel, gold, metal alloys, combinations thereof, any suitable materials having electrical conductivities, etc. It is noted that that in FIG. 2C, four dielectric layers (1221, 1222, 1223, and/or 1224) and three circuit layers (1241, 1242, and 1243) are shown for illustrative purpose only, and the number of the dielectric layers and the number of the circuit layers construe no limitation in the disclosure.

With continued reference to FIG. 1 and FIGS. 2A-2D, the circuit layers 124 may carry different electrical signals. In some embodiments, the circuit layer 1241 disposed on the dielectric layer 1221 and covered by the dielectric layer 1222 overlying the dielectric layer 1221 is configured to carry power signals. The circuit layer 1241 may be referred to as a power line. The circuit layers 1243 may be disposed above the circuit layer 1241, as shown in FIGS. 2C-2D. The circuit layers 1243 may be disposed on the dielectric layer 1223 and covered by the dielectric layer 1224 overlying the dielectric layer 1223, as shown in FIG. 2C. One or more probe contact(s) 132 may be connected to the circuit layers 1243, as shown in FIG. 2A. In some embodiments, the respective probe contact 132 has a circular top-view shape as shown in FIG. 2A. Although the probe contacts 132 may have any desired top-view shape (e.g., square shape, oval shape, triangular shape, rectangular shape, polygonal shape, etc.).

With continued reference to FIG. 1 and FIGS. 2A-2D, the respective first region R1 may have at least two (or more than two) circuit layers 1243 connected thereto. In some embodiments, the probe contacts 132 connected to the circuit layers 1243 are used for millimeter wave RF applications. The probe contacts 132 connected to the circuit layers 1243 may be capable of carrying signals with frequencies higher than, e.g., about 20 GHz. The high frequency range used herein may span from, e.g., about 30 GHz to about 90 GHz. In some embodiments, the high frequency signals (e.g., RF signals) are transferred to/from the respective DUT through the circuit layers 1243 and the probe contacts 132. In some embodiments, the circuit layers 1243 are referred to as RF signal lines (e.g., RF1 and RF2). The RF signal line RF1 may include a lateral dimension (e.g., the width) W1 measured in the first direction D1, and the RF signal line RF2 may include a lateral dimension W2 measured in the first direction D1. The lateral dimensions W1 and W2 may be substantially equal or may be different.

As the number of the DUTs increases, the number of the first regions R1 may correspondingly increase, tightening the pitch P1 between adjacent first regions R1. In implementations involving RF testing, more RF channels coming from the respective DUT need to be arranged in the second regions R2. Therefore, the RF signals adjacent to each other may be subject to crosstalk between the RF signal lines. To minimize such crosstalk, a shielding structure SD1 (see FIG. 2C) may be interposed between adjacent RF signal lines (RF1 and RF2). For example, the adjacent RF signal lines (RF1 and RF2) are disposed at a same level and laterally spaced apart from each other by a lateral distance LD1 measured in the first direction D1, and the shielding structure SD1 is disposed in the lateral distance LD1 to minimize coupling between the RF signal lines (RF1 and RF2). In some embodiments, the lateral distance LD1 is less than six times the lateral dimension W1 of the RF signal line RF1 (or lateral dimension W2 of the RF signal line RF2), i.e. LD1<6*W1 (or W2).

With continued reference to FIGS. 2C-2D and FIGS. 1 and 2A-2B, the circuit layers 1242 may act as a part of the shielding structure SD1 to prevent signals carried on one of the RF signal lines (RF1 and RF2) from creating cross-talk on the other one of RF signal lines (RF1 and RF2). For example, the shielding structure SD1 includes at least two shielding patterns (e.g., SP1 and SP2) and dielectric isolations (e.g., D11, D12, D13, D21, and D22) separating the shielding patterns and the RF signal lines from one another. In the cross-sectional view of FIG. 2C, the shielding pattern SP1 may be disposed in proximity to the RF signal line RF1 and isolated from the RF signal line RF1 by the dielectric isolation D11 (e.g., a part of the dielectric layer 1224) and the dielectric layer 1223. The shielding pattern SP2 may be disposed in proximity to the RF signal line RF2 and isolated from the RF signal line RF2 by the dielectric isolation D12 (e.g., a part of the dielectric layer 1224) and the dielectric layer 1223. In some embodiments, the lateral dimension WD22 of the dielectric isolation D22 is greater than the lateral dimension WD11 of the dielectric isolation D11 underlying the dielectric isolation D22.

With continued reference to FIGS. 2C-2D and FIGS. 1 and 2A-2B, the shielding patterns (SP1 and SP2) may be isolated from each other by the dielectric isolation D13 (e.g., a part of the dielectric layer 1224) and the dielectric layer 1223, as shown in FIG. 2C. In some embodiments, the lateral dimension WD22 of the dielectric isolation D22 is greater than the lateral dimension WD13 of the dielectric isolation D13 overlying the dielectric isolation D22. The shielding patterns (SP1 and SP2) are the circuit layers 1242 and may be made of one or more conductive material(s) or any suitable material capable of shielding, and the dielectric isolations (e.g., D11, D12, D13, and D21) are portions of the dielectric layers (1223 and 1224) and made of one or more dielectric material(s). The shielding patterns (SP1 and SP2), i.e. the circuit layers 1242, may be electrically connected to a constant voltage, such as the ground signals or reference voltage/signals. In some embodiments, the probe contacts 134 (labeled in FIG. 2A) connected to the circuit layers 1242 are capable of carrying the ground signals. In some embodiments, the respective probe contact 134 has a circular top-view shape as shown in FIG. 2A. Although the probe contacts 134 may have any desired top-view shape (e.g., square shape, oval shape, triangular shape, rectangular shape, polygonal shape, etc.).

With continued reference to FIGS. 2C-2D and FIGS. 1 and 2A-2B, the circuit layers 1242 may include at least two first layers (e.g., G1 and G2) disposed on the dielectric layer 1223 and covered by the dielectric layer 1224, at least two second layers (e.g., BG1 and BG2) disposed on the dielectric layer 1222 and covered by the dielectric layer 1223, and at least two vias (e.g., GV1 and GV2; also called “guard vias”) laterally covered by the dielectric layer 1223 and connected to the first layers (G1 and G2) and the second layers (BG1 and BG2). For example, the via GV1 is connected to the first layer G1 and the second layer BG1 in a second direction D2, and the via GV2 is connected to the first layer G2 and the second layer BG2 in the second direction D2, where the second direction D2 is substantially perpendicular to the first direction D1. Without intending the structures disclosed herein to be limited to any particular orientation, the second direction D2 may be referred to as the Z-direction or the thickness/height direction. The shielding pattern SP1 may include the first layer G1, the second layer BG1, and the via GV1 connected to the first layer G1 and the second layer BG1. The shielding pattern SP2 may include the first layer G2, the second layer BG2, and the via GV2 connected to the first layer G2 and the second layer BG2. The shielding structure SD1 may include at least one common ground. For example, a portion of the second layer BG1 acts as a common ground and/or a portion of the second layer BG2 acts as a common ground.

With continued reference to FIGS. 2C-2D and FIGS. 1 and 2A-2B, the RF signal lines (RF1 and RF2) and the first layers (G1 and G2) may be disposed at the same level (e.g., an outermost circuit level of the circuitry film 120). In some embodiments, at least one dielectric isolation (e.g., D13) is laterally interposed between the adjacent first layers (G1 and G2) to separate the first layer G1 from the first layer G2. The second layers (BG1 and BG2) may be disposed below the RF signal lines (RF1 and RF2) and the first layers (G1 and G2), as shown in the cross-sectional view of FIG. 2C. In some embodiments, at least one dielectric isolation (e.g., D21) is laterally interposed between the adjacent second layers (BG1 and BG2) to separate the second layer BG1 from the second layer BG2. The RF signal line RF1 may be laterally spaced apart from the first layer G1 by the dielectric isolation D11 of the dielectric layer 1224.

As shown in the top view of FIG. 2A, the dielectric isolation D11 conformally encircles the RF signal line RF1 to isolate the RF signal line RF1 from the first layer G1 of the shielding pattern SP1. The RF signal line RF2 may be laterally spaced apart from the first layer G2 by the dielectric isolation D12 of the dielectric layer 1224 in the cross-sectional view of FIG. 2C. As shown in the top view of FIG. 2A, the dielectric isolation D12 conformally encircles the RF signal line RF2 to separate the RF signal line RF2 from the first layer G2 of the shielding pattern SP2. The first layer G1 may be laterally spaced apart from the first layer G2 by the dielectric isolation D13 of the dielectric layer 1224. As shown in the top view of FIG. 2A, the dielectric isolation D13 may be formed as a strip separating the first layer G1 from the first layer G2. The second layers (BG1 and BG2) may be laterally spaced apart from each other by the dielectric isolation D21 of the dielectric layer 1223 in the cross-sectional view of FIG. 2C. As shown in the top view of FIG. 2B, the dielectric isolation D21 may be formed as a strip separating the second layer BG1 from the second layer BG2. The vias (GV1 and GV2) may be laterally spaced apart from each other by the dielectric isolation D22 of the dielectric layer 1223, as shown in the cross-sectional view of FIG. 2C.

With continued reference to FIGS. 2A-2B, the shielding structure SD1 may include a plurality of vias (e.g., GV1 and GV2) arranged along the contour of the respective RF signal line (RF1 or RF2). As shown in the top view of FIG. 2A, the vias GV1 are arranged at opposing sides of the RF signal line RF1 and arranged around the upper end of the RF signal line RF1 which connects the opposing sides of the RF signal line RF1. Similarly, the vias GV2 may be arranged at opposing sides of the RF signal line RF2 and arranged around the upper end of the RF signal line RF2 which connects the opposing sides of the RF signal line RF2, as shown in the top view of FIG. 2A. The vias GV1 may be arranged along a lengthwise direction of the first layer G1 (or the second layer BG1), and the vias GV2 may be arranged along a lengthwise direction of the first layer G2 (or the second layer BG2). In some embodiments, the adjacent rows of the vias GV1 and the vias GV2 between the RF signal lines (RF1 and RF2) are disposed in a staggered manner to minimize coupling between RF signal lines (RF1 and RF2), as shown in FIGS. 2A, 2B, and 2D. For example, the adjacent rows of the vias GV1 and the vias GV2 are offset from one another in the first direction D1 and a third direction D3, where the third direction D3 is substantially perpendicular to the first direction D1 and the second direction D2. The offset arrangement of the vias (GV1 and GV2) may facilitate the reduction in cross-talk interference.

The shielding structure SD1 may be configured to isolate the RF signal line RF1 from the RF signal line RF2 and to prevent noise coupling between the RF signal lines (RF1 and RF2). The shielding structure SD1 may include the shielding patterns (SP1 and SP2) separating from each other, the dielectric isolations (D21, D22, and D13) interposed between the shielding patterns (SP1 and SP2) to electrically isolate the shielding patterns (SP1 and SP2) from each other, and the dielectric isolations (D11 and D22) interposed between the shielding patterns (SP1 and SP2) and the RF signal lines (RF1 and RF2) to electrically isolate the shielding patterns (SP1 and SP2) from the RF signal lines (RF1 and RF2). In some embodiments where the RF signal lines (RF1 and RF2) has the tightened spacing (e.g., $LD1<6*W1$ (or $W2$)), by interposing the shielding structure SD1 between the RF signal lines (RF1 and RF2), the RF signal lines (RF1 and RF2) may tend to electromagnetically couple more to the shield structure SD1 and less with each other, thereby reducing cross-talk interference during the probe testing. For example, compared to the circuitry film including a single shielding pattern, the circuitry film 120 including the shielding structure SD1 may reduce the cross-talk effect between two RF signals below around −40 decibels (dB) in a range of operating frequencies from about 30 GHz to about 80 GHz.

Figure 3:
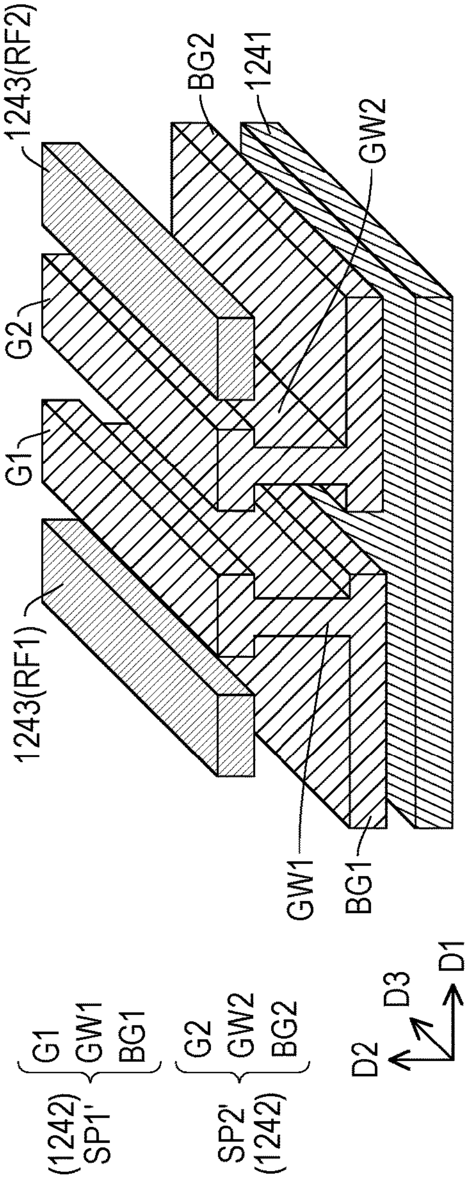
FIG. 3 is a schematic perspective view of a variation of the structure shown in FIG. 2D according to some embodiments.

FIG. 3 is a schematic perspective view of a variation of the structure shown in FIG. 2D, in accordance with some embodiments. Note that the dielectric layer is not shown in FIG. 3 to more clearly illustrate details of the circuit layers. Unless specified otherwise, the components in FIG. 3 are essentially the same as the like components denoted by like reference numerals in FIG. 2D. Referring to FIG. 3 and with reference to FIG. 2D, the structure shown in FIG. 3 is similar to the structure shown in FIG. 2D, except that the vias of the shielding patterns shown in FIG. 2D are replaced with one or more shielding wall(s) (e.g., GW1 and GW2). For example, the shielding pattern SP1' includes the shielding wall GW1 connected to the first layer G1 and the second layer BG1 and extending along the lengthwise direction of the first layer G1 and/or the second layer BG1. The shielding pattern SP2' may include the shielding wall GW2 connected to the first layer G2 and the second layer BG2 and extending along the lengthwise direction of the first layer G2 and/or the second layer BG2. The respective shielding wall (GW1 or GW2) may be formed as a continuous wall or discrete wall segments, depending on product and process requirements. Due to the presence of the shielding walls (GW1 and GW2) of the shielding patterns (SP1' and SP2'), the interference between the RF signal lines (RF1 and RF2) may further be suppressed.

Figure 4:
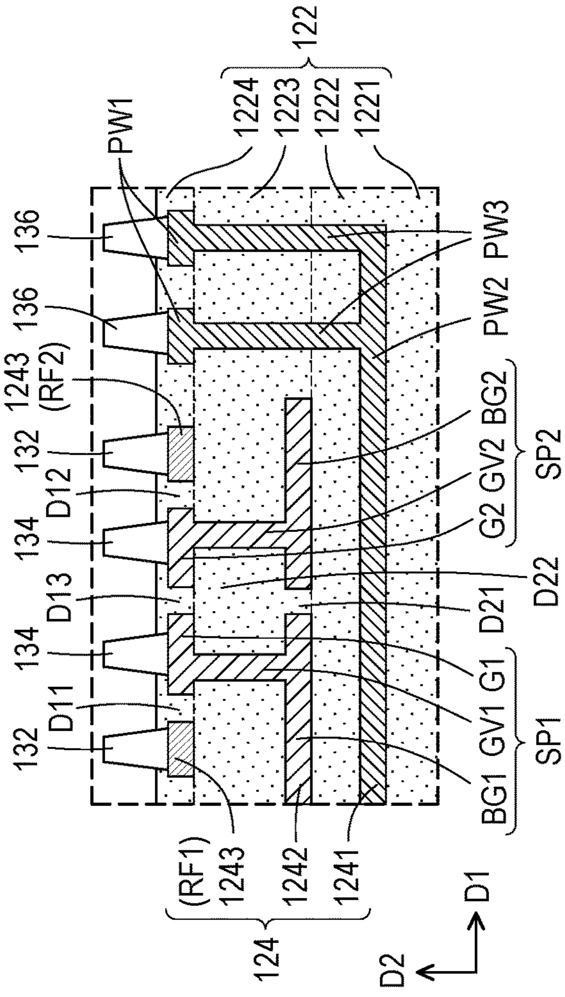
FIG. 4 is a schematic cross-sectional view of another portion of a circuitry film with probe contacts according to some embodiments.

FIG. 4 is a schematic cross-sectional view of another portion of the circuitry film 120 with probe contacts according to some embodiments. Unless specified otherwise, the components in FIG. 4 are essentially the same as the like components denoted by like reference numerals in FIG. 2C. Referring to FIG. 4 and with reference to FIG. 2C, the structure shown in FIG. 4 is similar to the structure shown in FIG. 2C, and thus the detailed descriptions are not repeated for the sake of brevity. The cross-sectional view of FIG. 4 shows that the probe contacts 132 are connected to the RF signal lines (RF1 and RF2), the probe contacts 134 are connected to the first layers (G1 and G2) of the shielding patterns (SP1 and SP2), and one or more probe contact(s) 136 may be connected to circuit layer 1241 (e.g., the power lines). In some embodiments, the probe contacts 132 are capable of carrying the RF signals, the probe contacts 134 are capable of carrying the ground signals, and the probe contacts 136 are capable of carrying the power signals. The respective probe contact (132, 134, or 136) may have a trapezoid cross-sectional shape. However, the respective probe contact (132, 134, or 136) may have a different cross-sectional shape (e.g., a rectangular shape, a square shape, a polygonal shape, etc.) than shown.

In some embodiments, the circuit layer 1241 includes first portions PW1 disposed on the dielectric layer 1223 and covered by the dielectric layer 1224 overlying the dielectric layer 1223, a second portion PW2 below the first portions PW1 and covered by the dielectric layer 1222 overlying the dielectric layer 1221, via portions PW3 connected to the first portions PW1 and the second portion PW2, where the probe contacts 136 may land on the first portions PW1. In some embodiments, the first portions PW1 are arranged aside the RF signal line RF2 (or the RF signal line RF1). The second portion PW2 may be disposed below the second layers (BG1 and BG2) of the shielding patterns (SP1 and SP2). The respective via portion PW3 may penetrate through the dielectric layer 1223 into the dielectric layer 1222 underlying the dielectric layer 1223 to be in contact with the second portion PW2. In some embodiments, the RF signal lines (RF1 and RF2), the first layers (G1 and G2) of the shielding patterns (SP1 and SP2), and the first portions PW1 of the circuit layer 1241 are embedded in the dielectric layer 1224 (e.g., the topmost one of the dielectric layer 122). The bottom portion of the respective probe contact (132, 134, or 136) may be laterally covered by the dielectric layer 1224 for protection. It should be noted that the circuit layers 124 may have a different configuration than shown.

Figure 5A:
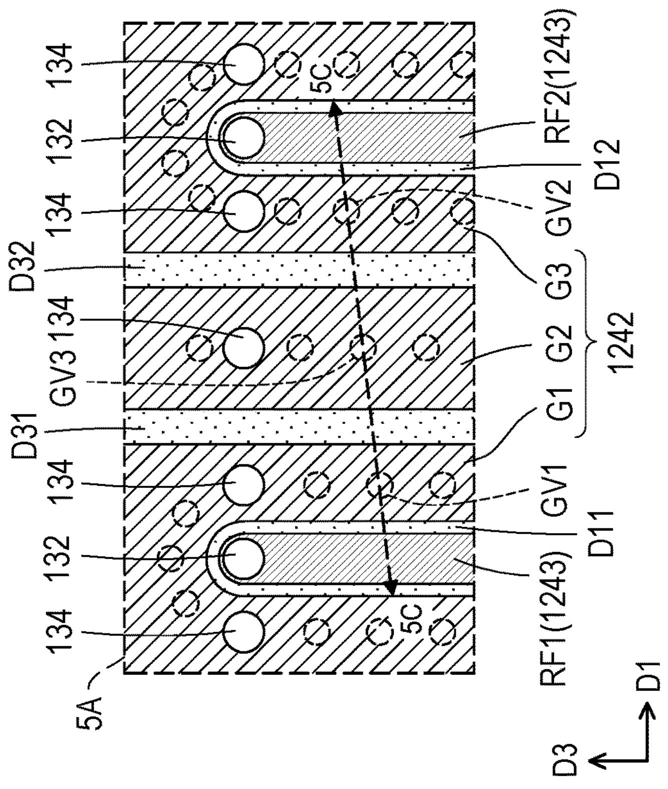
FIG. 5A is a schematic enlarged view of an upper level of a portion of a variation of a circuitry film according to some embodiments.
Figure 5B:
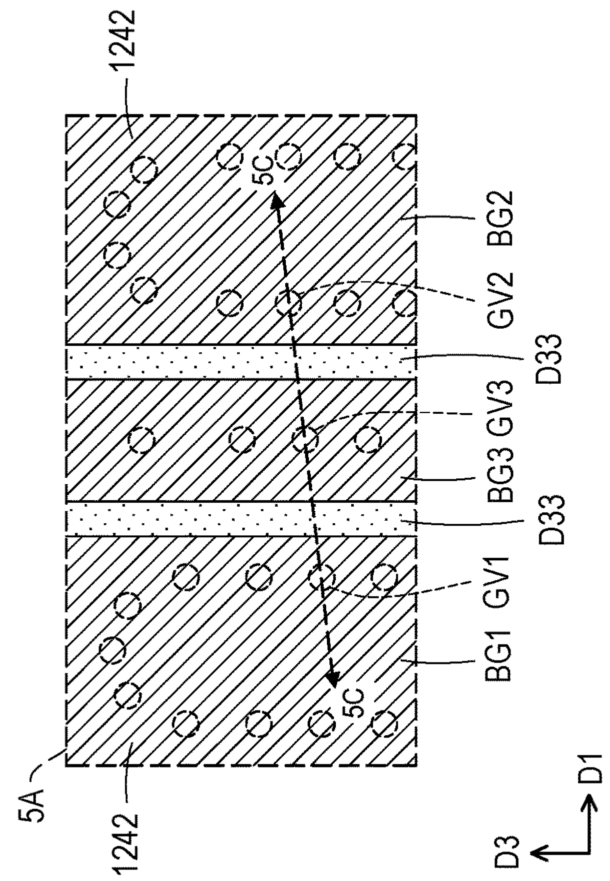
FIG. 5B is a schematic enlarged view of a lower level of the portion of the variation of the circuitry film according to some embodiments.
Figure 5C:
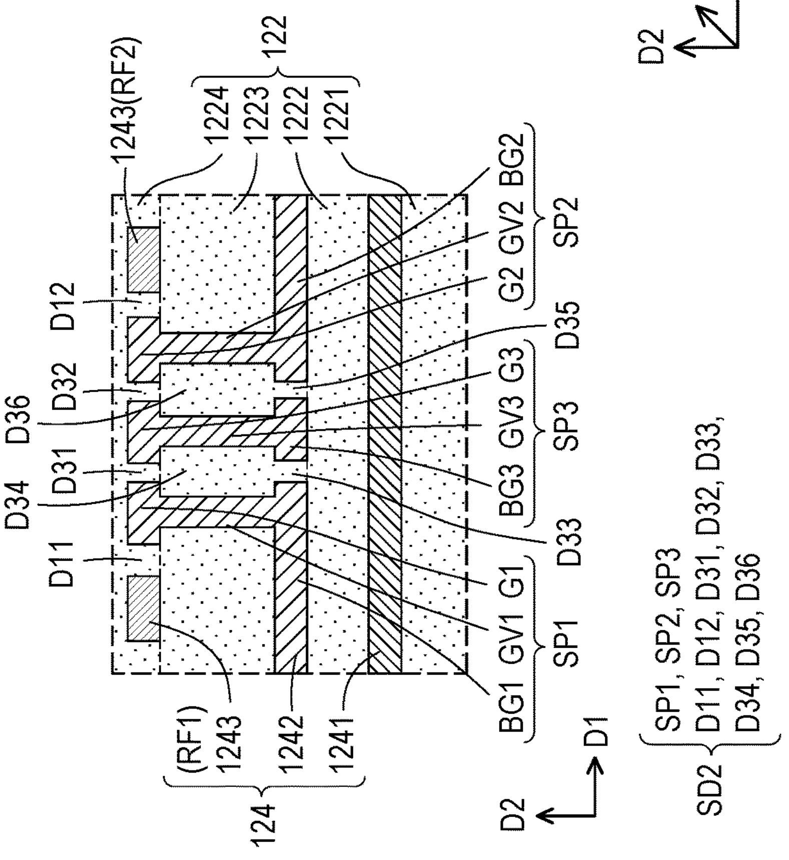
FIG. 5C is a schematic cross-sectional view of the portion of the circuitry film taken along the line 5C-5C of FIG. 5A and FIG. 5B according to some embodiments.
Figure 5D:
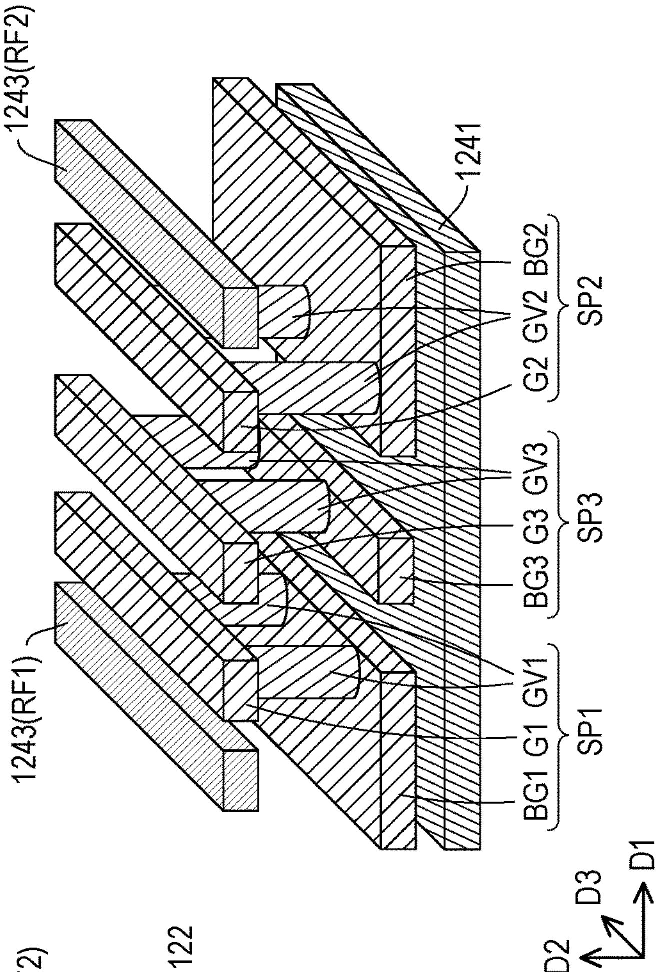
FIG. 5D is a schematic perspective view of the portion of the circuitry film shown in FIG. 5C according to some embodiments.

FIG. 5A is a schematic enlarged view of an upper level of a portion of a variation of the circuitry film 120 outlined in the dashed box 5A in FIG. 1, FIG. 5B is a schematic enlarged view of a lower level of the portion of the variation of the circuitry film 120 outlined in the dashed box 5A in FIG. 1, FIG. 5C is a schematic cross-sectional view of the portion of the circuitry film taken along the line 5C-5C of FIG. 5A and FIG. 5B, and FIG. 5D is a schematic perspective view of the portion of the circuitry film shown in FIG. 5C, in accordance with some embodiments. Note that the dielectric layer is not shown in FIG. 5D to more clearly illustrate details of the circuit layers. Unless specified otherwise, the components in FIGS. 5A-5D are essentially the same as the like components denoted by like reference numerals in FIGS. 2A-2D.

Referring to FIGS. 5A-5D and with reference to FIGS. 2A-2D, the structures shown in the views of FIGS. 5A-5D are similar to the structures shown in the views of FIGS. 2A-2D, respectively. The differences include that the shielding structure SD2 in FIGS. 5A-5D further includes additional shielding pattern SP3 interposed between the shielding patterns (SP1 and SP2) and additional dielectric isolations (D31, D32, D33, D34, D35, and D36) separating the shielding pattern SP3 from the shielding patterns (SP1 and SP2). For example, the shielding pattern SP3 includes the first layer G3, the second layer BG3 below the first layer G3, and the via GV3 connected to the first layer G3 and the second layer BG3. One or more probe contact(s) 134 may be connected to the first layer G3 of the shielding pattern SP3 and configured to carry the ground signals. In some embodiments, the dielectric layer 1224 includes portions serving as the dielectric isolations (e.g., D31 and D32). For example, the dielectric isolation D31 laterally separates the first layer G1 of the shielding pattern SP1 from the first layer G3 of the shielding pattern SP3, and the dielectric isolation D32 laterally separates the first layer G2 of the shielding pattern SP2 from the first layer G2.

With continued reference to FIGS. 5A-5D, the dielectric layer 1223 underlying the dielectric layer 1224 may include portions serving as the dielectric isolations (e.g., D33, D34, D35, and D36). For example, the dielectric isolation D33 separates the second layer BG1 of the shielding pattern SP1 from the second layer BG3 of the shielding pattern SP3, the dielectric isolation D34 overlying the dielectric isolation D33 separates the via GV1 of the shielding pattern SP1 from the via GV3 of the shielding pattern SP3. Similarly, the dielectric isolation D35 may isolate the second layer BG2 of the shielding pattern SP2 from the second layer BG3 of the shielding pattern SP3, the dielectric isolation D36 overlying the dielectric isolation D35 may isolate the via GV2 of the shielding pattern SP2 from the via GV3 of the shielding pattern SP3. The vias GV3 and the adjacent row of the vias GV1 (and/or GV3) may be arranged in a staggered manner to minimize coupling between RF signal lines (RF1 and RF2), as shown in FIGS. 5A, 5B, and 5D. For example, the adjacent three rows of the vias (GV1, GV3, and GV2) are fully (or partially) offset from one another in the first direction D1 and the third direction D3, within process variations. The offset arrangement of the vias (GV1, GV3, and GV2) may facilitate the reduction in cross-talk interference. By interposing additional shielding pattern SP3 between adjacent shielding patterns (SP1 and SP2), the cross-talk effect existing in the circuitry film 120 may be reduced.

Figure 6:
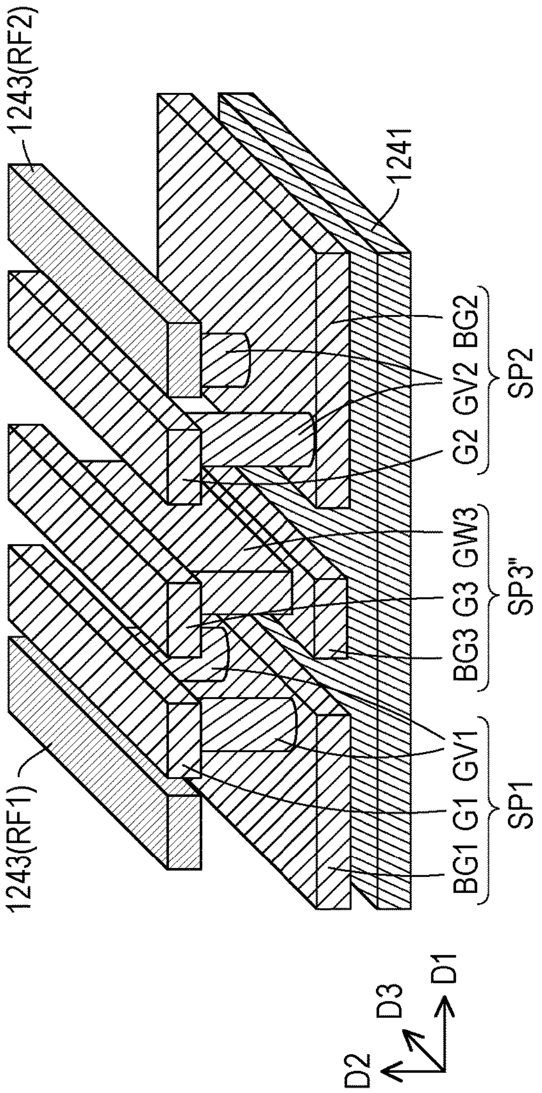
FIG. 6 is a schematic perspective view of a variation of the structure shown in FIG. 5D according to some embodiments.

FIG. 6 is a schematic perspective view of a variation of the structure shown in FIG. 5D according to some embodiments. Note that the dielectric layer is not shown in FIG. 6 to more clearly illustrate details of the circuit layers. Unless specified otherwise, the components in FIG. 6 are essentially the same as the like components denoted by like reference numerals in FIG. 5D. Referring to FIG. 6 and with reference to FIG. 5D, the structure shown in FIG. 6 is similar to the structure shown in FIG. 5D, except that the vias of the shielding pattern SP3 are replaced with a shielding wall GW3. For example, the shielding pattern SP3" includes the shielding wall GW3 connected to the first layer G3 and the second layer BG3. The shielding wall GW3 may be formed as a continuous wall or discrete wall segments, depending on product and process requirements. Due to the presence of the shielding wall GW3, the interference between the RF signal lines (RF1 and RF2) may be suppressed. It should be appreciated that the vias GV1 of the shielding pattern SP1 and/or the vias GV2 of the shielding pattern SP2 may also be replaced with the shielding wall(s) as mentioned in FIG. 3, depending on product and process requirements.

Figure 7:
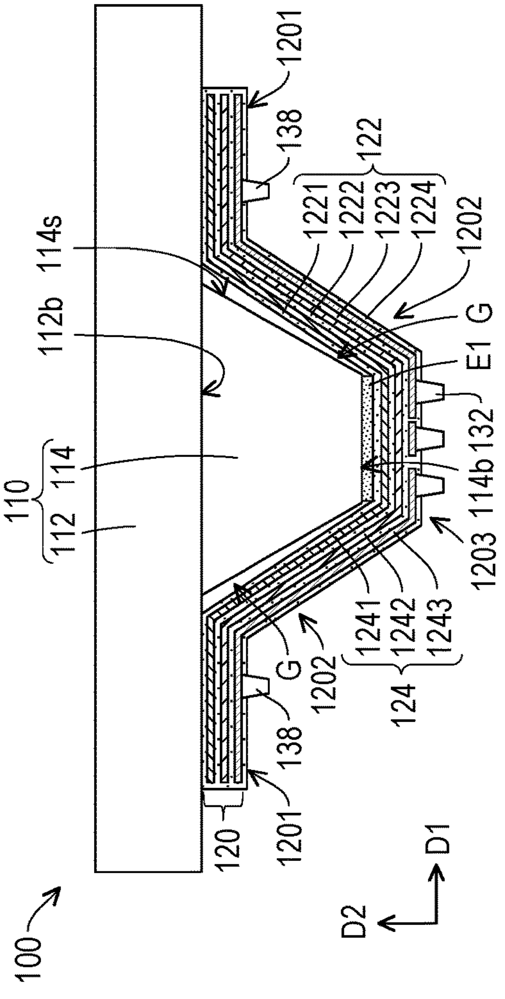
FIG. 7 is a schematic cross-sectional view of a part of a probing apparatus according to some embodiments.

FIG. 7 is a schematic cross-sectional view of a part of a probing apparatus according to some embodiments. Referring to FIG. 7, a probing apparatus 100 may include a fixture 110 and the circuitry film 120 attached to the fixture 110. In some embodiments, the fixture 110 includes a base 112 and a protrusion 114 connected to the base 112. The fixture 110 may be hollow or may be solid. For example, the base 112 serving as a support element is formed of rigid material such as metal, hard dielectrics, suitable incompressible materials, combinations thereof, etc. In some embodiments, the base 112 provides a grounding path for a DUT (see FIG. 9). In some embodiments, the protrusion 114 is formed of insulating material, composite material including polymer and metal, and/or the like. The protrusion 114 may extend from the bottom surface 112*b* of the base 112 in the second direction D2. For example, the protrusion 114 extends downward from the bottom surface 112*b* of the base 112 in an inclined manner. The sidewalls 114*s* of the protrusion 114 may be tilted from the base 112. The protrusion 114 may be in the shape of an inverted trapezoid seen from the cross-sectional view. Alternatively, the cross-section of the protrusion 114 may be a U-shape, a rectangular shape, a square shape, and/or the like. The base 112 may be wider than the protrusion 114, and a portion of the bottom surface 112*b* of the base 112 is unmasked by the protrusion 114.

With continued reference to FIG. 7, the circuitry film 120 may be thin and mechanically flexible. When attaching the circuitry film 120 to the fixture 110, the circuitry film 120 may be bent to substantially fit the contour of the fixture 110. In some embodiments, the circuitry film 120 does not fully match the shape of the fixture 110. The gap G may (or may not) be formed between the sidewalls 114*s* of the protrusion 114 and the circuitry film 120. For example, the circuitry film 120 includes first portions 1201 attached to the bottom surface 112*b* of the base 112 that is not covered by the protrusion 114, second portions 1202 connected to the first portions 1201 and extending along the sidewalls 114*s* of the protrusion 114, and a third portion 1203 connected to the second portions 1202 and extending to underlie the bottom surface 114*b* of the protrusion 114.

In some embodiments, an engaging mechanism E1 is disposed on the bottom surface 114*b* of the protrusion 114 for coupling the third portion 1203 of the circuitry film 120 to the fixture 110. The engaging mechanism E1 may be or may include adhesive, mechanically securing elements (e.g., fasteners, screws, pins, rivets, etc.), or other suitable engaging means. In some embodiments, additional engaging mechanism (not shown; e.g., screws and corresponding nuts) is configured to affix the third regions R3 (labeled in FIG. 1) of the circuitry film 120 to the base 112 of the fixture 110. Other arrangements may be possible depending on the requirements. The details of the circuitry film 120 may refer to the discussion associated with FIGS. 1-6, and the components of the circuitry film 120 in FIG. 7 are essentially the same as the like components of the circuitry film 120 denoted by like reference numerals in FIGS. 1-6.

As shown in FIG. 7, the probing apparatus 100 may include a plurality of probe contacts 132 electrically coupled to the circuitry layers 124. Note that the probe contacts 134 and 136 (see FIG. 4) are not shown in the cross-sectional view of FIG. 7. In some embodiments, the probing apparatus 100 includes one or more signal connector(s) 138 electrically coupled to the circuitry layers 124 of the circuitry film 120. For example, the probe contacts 132 are distributed on the third portion 1203 of the circuitry film 120 which extends across and underlies the bottom surface 114*b* of the protrusion 114. In some embodiments, the probe contacts (134 and 136; shown in FIG. 4) are distributed on the portion 1203 of the circuitry film 120. In some embodiments, one or more signal connector(s) 138 may be disposed on the first portions 1201 of the circuitry film 120 underlying the bottom surface 112*b* of the base 112. The respective probe contact 132 and the signal connector 138 may extend in the second direction D2. The signal connectors 138 may be arranged to be coupled to the subsequently mounted circuit board (e.g., "150" labeled in FIGS. 8A-9) for providing signal transmission. The probe contacts 132 (and 134, 136) may be arranged based on the specific IC design of the DUT. In some embodiments, the probe contacts 132 (and 134, 136) are referred to as probe tips. It should be understood that the probe contacts and the signal connectors are given for illustrative purposes, and various numbers, shapes, and configurations are within the contemplated scope of the disclosure.

Figure 8A:
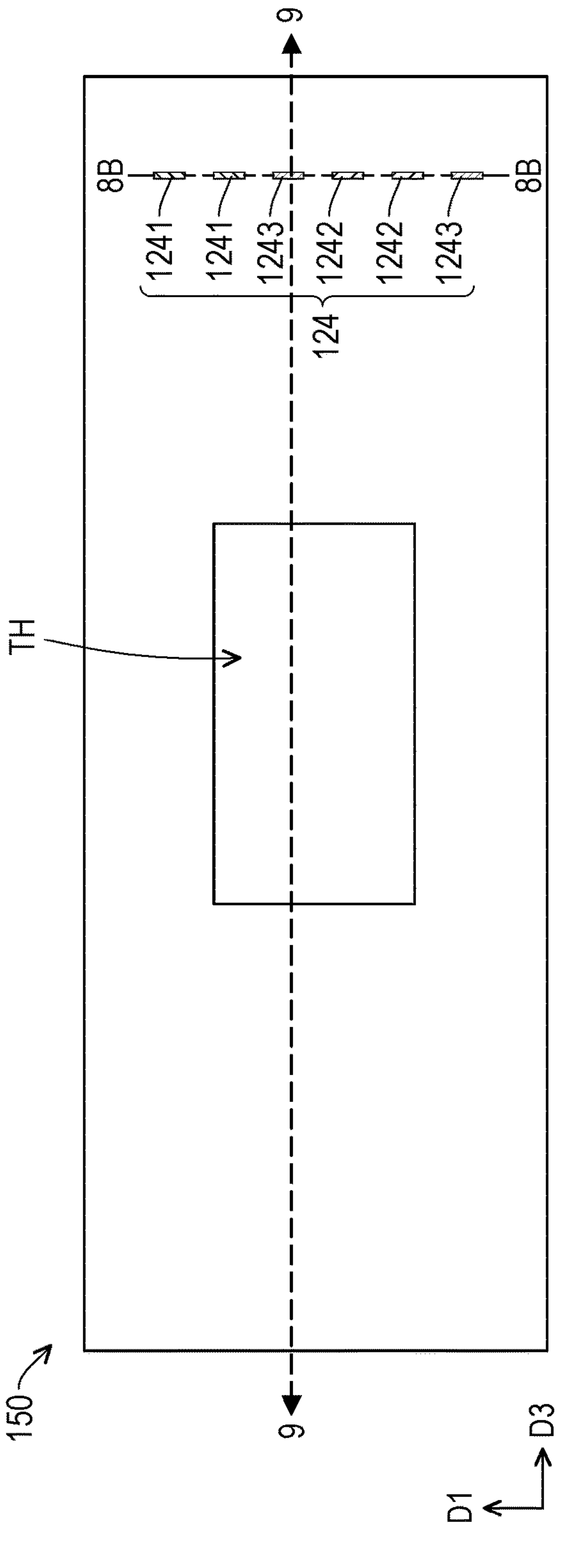
FIG. 8A is a schematic top view of a circuit board according to some embodiments.
Figure 8B:
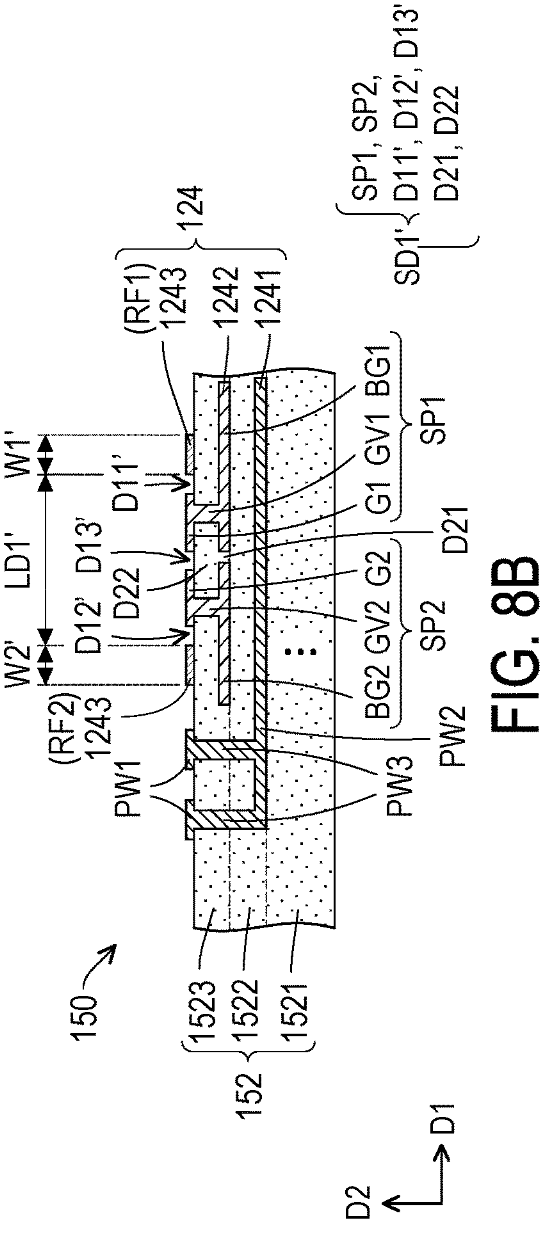
FIG. 8B is a schematic cross-sectional view of the circuit board taken along the line 8B-8B of FIG. 8A according to some embodiments.

FIG. 8A is a schematic top view of a circuit board 150 and FIG. 8B is a schematic cross-sectional view of the circuit board 150 taken along the line 8B-8B of FIG. 8A, in accordance with some embodiments. It should be noted that the circuit board 150 herein is illustrated in a simplified manner, and the circuit board 150 may include additional elements than shown. Referring to FIGS. 8A-8B and with reference to FIG. 7, the circuit board 150 may be a part of the probing apparatus 100 and configured to be attached to the fixture 110 as will be described later in accompanying with FIG. 9. For example, the circuit board 150 is provided with a through hole TH, and the protrusion of the fixture (see FIG. 9) may pass through the through hole TH. The circuit board 150 may be or may include a printed circuit board (PCB) including one or more dielectric layer(s) 152 and one or more circuit layer(s) 124 covered by the dielectric layers 152. The circuit layers 124 may include transmission lines (e.g., power lines, ground lines, RF signal lines, I/O pads, and/or the like).

With continued reference to FIGS. 8A-8B, the circuit board 150 may include a plurality of dielectric layers (1521, 1522, and 1523) stacked upon one another and a plurality of circuit layers (1241, 1242, and 1243) covered by the dielectric layers (1221, 1222, and 1223), as shown in FIG. 8B. The circuit layers (1241, 1242, and 1243) may be similar to the circuit layers (1241, 1242, and 1243) described in FIGS. 2A-2D. For example, the circuit layer 1241 is configured to carry the power signals and may include the first portions PW1 disposed on the dielectric layer 1523 (e.g., the topmost one of the dielectric layers 152), the second portion PW2 disposed on the dielectric layer 1521 and covered by the dielectric layer 1522 overlying the dielectric layer 1521, the via portions PW3 connecting the first portions PW1 to the second portion PW2, where the via portions PW3 penetrate through the dielectric layer 1523 into the dielectric layer 1522 underlying the dielectric layer 1523 to land on the second portion PW2. The circuit layers 1242 may be configured to carry the ground signals. The circuit layers 1241 may be disposed on the dielectric layer 1523 and configured to carry the high frequency signals (e.g., RF signals). The circuit layers 1241 may be referred to as the RF signal lines (e.g., RF1 and RF2).

In some embodiments, the RF signal lines (RF1 and RF2) are arranged to include the tightened spacing (e.g., LD1<6*W1 (or W2)) as described in FIGS. 2A-2D. The RF signal lines (RF1 and RF2) used in the circuit board 150 and the RF signal lines (RF1 and RF2) used in the circuitry film 120 (see FIGS. 1-2D) may have different lateral dimensions and a different lateral distance. For example, the lateral dimension W1' (or W2') of the RF signal line RF1 (or RF2) included in the circuit board 150 is greater than the lateral dimension W1 (or W2) of the RF signal line RF1 (or RF2) included in the circuitry film 120 (described in FIG. 2C). The lateral distance LD1' between the RF signal lines (RF1 and RF2) included in the circuit board 150 may be greater than the lateral distance LD1 between the RF signal lines (RF1 and RF2) included in the circuitry film 120 (described in FIG. 2C). In some embodiments, a ratio of the lateral distance LD1' to the lateral dimension W1' is less than a ratio of the lateral distance LD1 to the lateral dimension W1. This may cause the cross-talk interference become a more critical issue in the circuit board 150 than in the circuitry film 120.

To minimize such crosstalk, a shielding structure SD1' may be interposed between adjacent RF signal lines (RF1 and RF2) having the tightened spacing. For example, the shielding structure SD1' includes at least two shielding patterns (e.g., SP1 and SP2) and isolations (e.g., D11', D12', D13', D21, and D22) separating the shielding patterns and the RF signal lines from one another. The shielding structure SD1' shown in FIG. 8B is similar to the shielding structure SD1 described in FIG. 2C, and thus the detailed descriptions are not repeated for the sake of brevity. The difference between the shielding structure SD1' of the circuit board 150 and the shielding structure SD1 described in FIG. 2C includes that the dielectric isolations (D11, D12, and D13) are replaced with the ditches (D11', D12', and D13'). For example, the first layer G1 of the shielding pattern SP1 is disposed on the dielectric layer 1523 and laterally separated from the RF signal line RF1 by the ditch D11', the first layer G2 of the shielding pattern SP2 is also disposed on the dielectric layer 1523 and laterally separated from the RF signal line RF2 by the ditch D12', and the first layers (G1 and G2) are laterally separated from each other by the ditch D13'. It should be noted that the shielding patterns of the shielding structure SD1' included in the circuit board 150 may be replaced with the shielding patterns (SP1' and SP2') described in FIG. 3 or the shielding patterns (SP1, SP2, and SP3/SP3") described in FIGS. 5C and 6.

Figure 9:
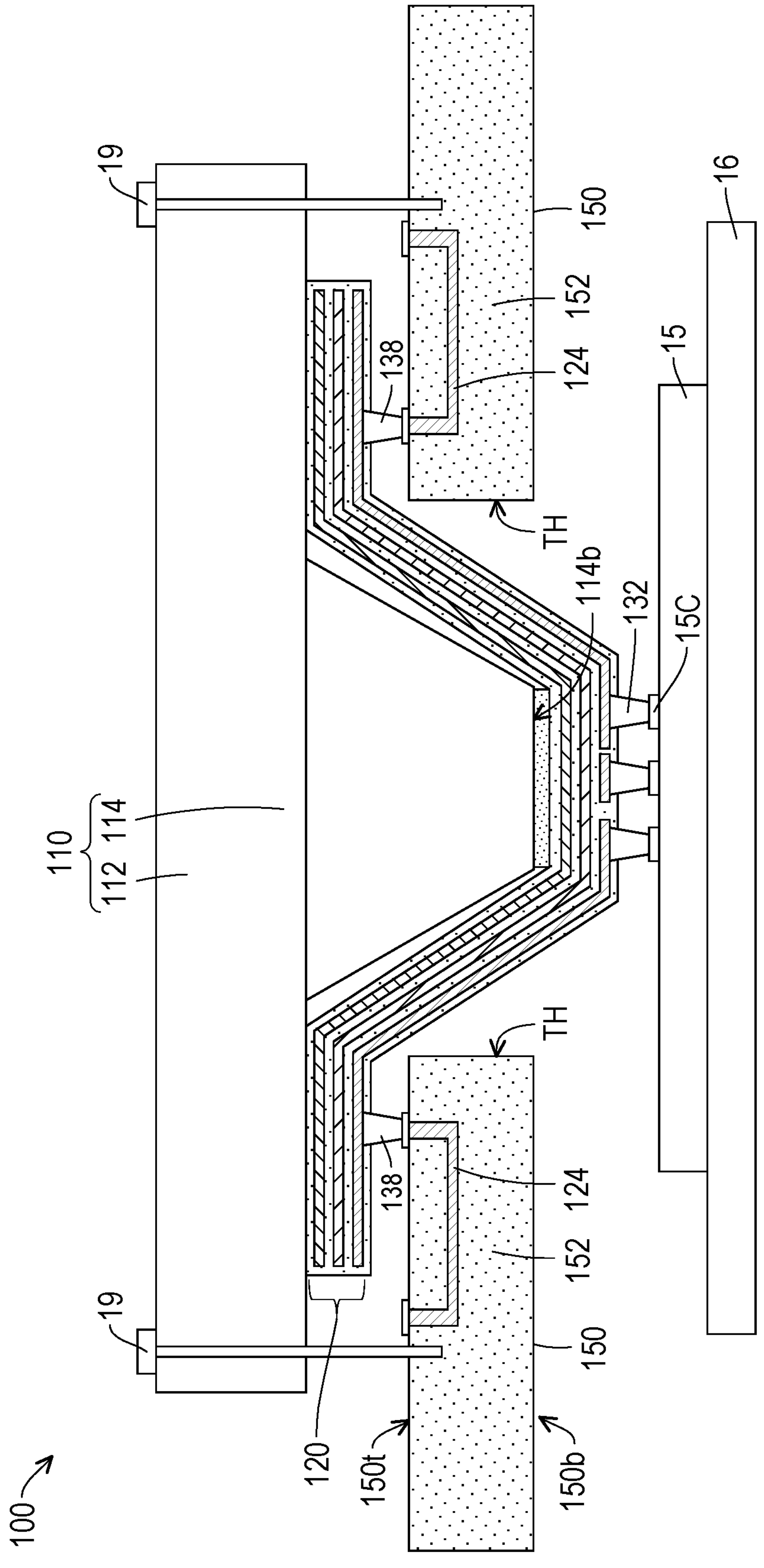
FIG. 9 is a schematic cross-sectional view of a probing apparatus configured to probe a device-under-test (DUT) according to some embodiments.

FIG. 9 is a schematic cross-sectional view of the probing apparatus 100 configured to probe a DUT according to some embodiments. Referring to FIG. 9 and with reference to FIGS. 7 and 8A-8B, the probing apparatus 100 includes the fixture 110, the circuitry film 120 attached to the fixture 110, and the circuit board 150 attached to the fixture 110 through one or more securing element(s) 19 (e.g., fasteners, screws, clamps, pins, rivets, other suitable engaging means, etc.). For example, the base 112 of the fixture 110 includes receiving openings at desirable locations, so that screws may be screwed through the receiving openings of the fixture 110 to be affixed onto the circuit board 150. Other suitable engaging manner may be employed as long as the engaging mechanism may be stably engaged with the fixture 110. Note that the circuit board 150 shown in FIG. 9 is a schematic cross-sectional view taken along the line 9-9 of FIG. 8A. The base 112 of the fixture 110 may be disposed above the top surface 150*t* of the circuit board 150 and across the through hole TH. The protrusion 114 of the fixture 110 may pass through the through hole TH of the circuit board 150. In some embodiments, the bottom surface 114*b* of the protrusion 114 extend lower than the bottom surface 150*b* of the circuit board 150, so that the probe contacts 132 disposed on the circuitry film 120 and below the bottom surface 114*b* of the protrusion 114 may probe the DUT 15 without being interfered.

In some embodiments, a method for probing the DUT 15 includes providing the probing apparatus 100 and probing the DUT 15 by the probe contacts (e.g., 132, 134, and 136). The step of providing the probing apparatus 100 may include attaching the circuitry film 120 to the fixture 110 and attaching the circuit board 150 to the fixture 110. In addition, the step of providing the probing apparatus 100 may include forming the aforementioned shielding structure in the circuitry film 120, forming the aforementioned shielding structure in the circuit board 150, or forming the aforementioned shielding structure in both of the circuitry film 120 and the circuit board 150. During the testing, the probe contacts 132 (and 134 and 136; not shown in the cross-sectional view of FIG. 9) on the circuitry film 120 may be in physical and electrical contact with the contact points 15C of the DUT 15.

With continued reference to FIG. 9, the DUT 15 may be mounted on a chuck 16 during the testing. For example, the chuck 16 which supports the DUT 15 is configured to move the DUT 15. The chuck 16 may be moved in any direction (e.g., x, y, z, tilt angle, etc.) through suitable moving mechanism (not shown) in order to bring the contact points 15C of the DUT 15 into engagement with the probe contacts 132 (and 134 and 136; not shown). The contact points 15C may be or may include contact pads, metal bumps, solder balls, etc. In some embodiments, the DUT 15 is a semiconductor wafer including a plurality of dies (not shown). The probe contacts 132 may be in contact with the contact points 15C of each die of the semiconductor wafer for testing. Although a single DUT is shown in FIG. 9, it should be noted that a plurality of the DUTs 15 arranged in an array may be disposed on the chuck 16 for the testing.

As mentioned in the preceding paragraphs, as the number of the DUTs 15 increases, the spacing between adjacent DUTs 15 gets tightened. In implementations involving RF testing, more RF channels come from the respective DUT 15, and the RF signals adjacent to each other may be subject to crosstalk between the RF signal lines. To minimize such crosstalk, the shielding structure may be included in the circuitry film 120 and/or the circuit board 150. The probing apparatus 100 may include the aforementioned shielding structure(s) in the circuitry film 120 alone, in the circuit board 150 alone, or in both of the circuitry film 120 and the circuit board 150. For example, the circuitry film 120 described in FIGS. 1-2D may be included in the probing apparatus 100 for probe testing. The shielding patterns in the circuitry film 120 may be replaced with the structure described in FIG. 3 according to some embodiments. In alternative embodiments, the shielding structure in the circuitry film 120 of the probing apparatus 100 is replaced with the shielding structure SD2 described in FIGS. 5A-5D or FIG. 6. The circuit board 150 described in FIGS. 8A-8B may (or may not) be included in the probing apparatus 100 for probe testing, depending on the demands of RF testing.

According to some embodiments, an apparatus for probing a DUT includes a fixture disposed over the DUT, a circuitry film attached to the fixture, probe contacts disposed on the circuitry film and extending toward the DUT, a circuit board electrically coupled to the circuitry film, a first high frequency signal line and a second high frequency signal line laterally spaced apart from the first high frequency signal line. The first and second high frequency signal lines are included in at least one of the circuitry film or the circuit board. A shielding structure is interposed between the first and second high frequency signal lines and includes a first shielding pattern disposed in proximity to the first high frequency signal line and a second shielding pattern disposed in proximity to the second high frequency signal line and laterally spaced apart from the first shielding pattern.

According to some embodiments, an apparatus for probing a DUT includes a fixture including a base and a protrusion connected to the base and extending toward the DUT, a circuitry film disposed along a contour of the fixture, probe contacts connected to the circuitry film to probe the DUT, a circuit board disposed below the base of the fixture and electrically coupled to the circuitry film, a first high frequency signal line and a second high frequency signal line laterally separated from the first high frequency signal line, and a shielding structure interposed between the first and second high frequency signal lines. The protrusion of the fixture passes through the circuit board. The first and second high frequency signal lines are included in at least one of the circuitry film or the circuit board, and a lateral distance between the first and second high frequency signal lines is less than six times a lateral dimension of the first high frequency signal line. The shielding structure includes isolations and shielding patterns isolated from one another by the isolations.

According to some embodiments, a method for probing a DUT includes providing a probing apparatus and probing the DUT by probe contacts of the probing apparatus. The probing apparatus includes a fixture including a base and a protrusion connected to the base, a circuitry film disposed along the fixture, the probe contacts disposed on the circuitry film and below the protrusion of the fixture, a circuit board electrically coupled to the circuitry film, a first high frequency signal line and a second high frequency signal line laterally separated from the first high frequency signal line, and a shielding structure interposed between the first and second high frequency signal lines. The first and second high frequency signal lines are included in at least one of the circuitry film or the circuit board, and the shielding structure includes isolations and shielding patterns isolated from one another by the isolations.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for probing a device-under-test (DUT), comprising:
- a fixture disposed over the DUT;
- a circuitry film attached to the fixture;
- probe contacts disposed on the circuitry film and extending toward the DUT;
- a circuit board electrically coupled to the circuitry film; and
- a first high frequency signal line and a second high frequency signal line laterally spaced apart from the first high frequency signal line, the first and second high frequency signal lines being included in at least one of the circuitry film or the circuit board; and
- a shielding structure interposed between the first and second high frequency signal lines, the shielding structure comprising:
  - a first shielding pattern disposed in proximity to the first high frequency signal line; and
  - a second shielding pattern disposed in proximity to the second high frequency signal line and laterally spaced apart from the first shielding pattern.

2. The apparatus of claim 1, wherein each of the first and second shielding patterns comprises:
- a first portion disposed at a same level as the first and second high frequency signal lines;
- a second portion disposed below the first portion; and
- a third portion connected to the first and second portions.

3. The apparatus of claim 2, wherein the third portion comprises conductive vias spaced apart from one another and arranged along a lengthwise direction of the first portion.

4. The apparatus of claim 3, wherein the conductive vias of the first shielding patterns are offset from the conductive vias of the second shielding patterns.

5. The apparatus of claim 2, wherein the third portion is a conductive wall extending along a lengthwise direction of the first portion.

6. The apparatus of claim 2, wherein the shielding structure further comprises:
- a first dielectric isolation separating the second portion of the first shielding pattern from the second portion of the second shielding pattern; and
- a second dielectric isolation overlying the first dielectric isolation and separating the third portion of the first shielding pattern from the third portion of the second shielding pattern.

7. The apparatus of claim 6, wherein a lateral dimension of the second dielectric isolation is greater than that of the first dielectric isolation.

8. The apparatus of claim 6, wherein the first and second high frequency signal lines are included in the circuitry film, and the shielding structure further comprises:

a third dielectric isolation overlying the second dielectric isolation and separating the first portion of the first shielding pattern from the first portion of the second shielding pattern.

9. The apparatus of claim 6, wherein the first and second high frequency signal lines are included in the circuit board, and the shielding structure further comprises:

a ditch overlying the second dielectric isolation and separating the first portion of the first shielding pattern from the first portion of the second shielding pattern.

10. The apparatus of claim 1, wherein a spacing between the first and second high frequency signal lines is less than six times a lateral dimension of the first high frequency signal line.

11. The apparatus of claim 1, wherein the shielding structure further comprises a dielectric isolation conformally encircling the first high frequency signal line in a top view, and the first shielding pattern surrounds the dielectric isolation in the top view.

12. The apparatus of claim 1, wherein a base portion of the fixture is attached to the circuit board, and a protrusion portion of the fixture connected to the base portion passes through the circuit board and extends toward the DUT.

13. An apparatus for probing a device-under-test (DUT), comprising:

a fixture comprising a base and a protrusion connected to the base and extending toward the DUT;

a circuitry film disposed along a contour of the fixture;

probe contacts connected to the circuitry film to probe the DUT;

a circuit board disposed below the base of the fixture and electrically coupled to the circuitry film, the protrusion of the fixture passing through the circuit board;

a first high frequency signal line and a second high frequency signal line laterally separated from the first high frequency signal line, the first and second high frequency signal lines being included in at least one of the circuitry film or the circuit board, wherein a lateral distance between the first and second high frequency signal lines is less than six times a lateral dimension of the first high frequency signal line; and a shielding structure interposed between the first and second high frequency signal lines, the shielding structure comprising isolations and shielding patterns isolated from one another by the isolations.

14. The apparatus of claim 13, wherein each of the shielding patterns comprises:

a first portion interposed between the first and second high frequency signal lines;

a second portion disposed below the first portion and serving as a ground plane; and a third portion connected to the first and second portions.

15. The apparatus of claim 14, wherein:

the first portions of adjacent two of the shielding patterns are separated by a first dielectric isolation of the isolations, the second portions of the adjacent two of the shielding patterns are separated by a second dielectric isolation of the isolations underlying the first dielectric isolation, and the third portions of the adjacent two of the shielding patterns are separated by a third dielectric isolation of the isolations underlying the second dielectric isolation.

16. The apparatus of claim 14, wherein in a top view, a first dielectric isolation of the isolations encircles the first high frequency signal line and is interposed between the first high frequency signal line and the first portion of a first one of the shielding patterns.

17. The apparatus of claim 16, wherein in the top view, a second dielectric isolation of the isolations encircles the second high frequency signal line and is interposed between the second high frequency signal line and the first portion of a second one of the shielding patterns, and a third dielectric isolation of the isolations separates the first portion of the second one of the shielding patterns from the first portion of the first one of the shielding patterns.

18. The apparatus of claim 13, wherein the shielding patterns comprises:

a first shielding pattern surrounding opposing sides of the first high frequency signal line in a top view;

a second shielding pattern surrounding opposing sides of the second high frequency signal line in the top view;

a third shielding pattern interposed between the first and second shielding patterns and laterally spaced apart from the first and second shielding patterns by the isolations.

19. The apparatus of claim 13, wherein the shielding patterns are made of a same material as the first high frequency signal line, and the isolations are made of a dielectric material.

20. A method for probing a device-under-test (DUT), comprising:

providing a probing apparatus, wherein the probing apparatus comprises:

a fixture comprising a base and a protrusion connected to the base;

a circuitry film disposed along the fixture;

probe contacts disposed on the circuitry film and below the protrusion of the fixture;

a circuit board electrically coupled to the circuitry film;

a first high frequency signal line and a second high frequency signal line laterally separated from the first high frequency signal line, the first and second high frequency signal lines being included in at least one of the circuitry film or the circuit board; and a shielding structure interposed between the first and second high frequency signal lines, the shielding structure comprising isolations and shielding patterns isolated from one another by the isolations; and probing the DUT by the probe contacts of the probing apparatus.

* * * * *